United States Patent
Nagaraj et al.

(10) Patent No.: US 9,438,266 B1
(45) Date of Patent: Sep. 6, 2016

(54) CALIBRATED-OUTPUT ANALOG-TO-DIGITAL CONVERTER APPARATUS AND METHODS

(71) Applicant: TEXAS INSTRUMENTS INCORPORATED, Dallas, TX (US)

(72) Inventors: Krishnaswamy Nagaraj, Plano, TX (US); Manish Goel, Plano, TX (US); Xiao Pu, Plano, TX (US); Hun-Seok Kim, Ann Arbor, MI (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/040,572

(22) Filed: Feb. 10, 2016

(51) Int. Cl.
*H03M 1/10* (2006.01)
*H03M 3/00* (2006.01)

(52) U.S. Cl.
CPC ............ *H03M 3/464* (2013.01); *H03M 3/344* (2013.01); *H03M 3/38* (2013.01)

(58) Field of Classification Search
CPC ...... H03M 3/464; H03M 3/344; H03M 3/38; H03M 1/203; H03M 1/06; H03M 1/1023; H03M 1/10; H03M 1/1009; H03M 1/1071
USPC .................................. 341/143, 117–120, 155
See application file for complete search history.

(56) References Cited

U.S. PATENT DOCUMENTS

| | | | |
|---|---|---|---|
| 5,598,157 A | 1/1997 | Kornblum | |
| 6,160,506 A * | 12/2000 | Pellon | H03M 3/39 341/143 |
| 6,304,608 B1 * | 10/2001 | Chen | H03M 3/35 341/143 |
| 6,426,714 B1 * | 7/2002 | Ruha | H03M 1/066 341/118 |
| 6,449,569 B1 * | 9/2002 | Melanson | H03M 3/378 341/118 |
| 6,535,155 B2 * | 3/2003 | Ruha | H03M 1/067 341/120 |
| 6,642,813 B1 * | 11/2003 | Itakura | H03H 9/02582 310/313 A |
| 7,126,510 B2 * | 10/2006 | Alon | H03M 1/1023 341/118 |
| 7,548,178 B2 * | 6/2009 | Delano | H03M 3/464 341/118 |
| 7,969,335 B2 * | 6/2011 | Arias | H03M 3/388 341/118 |
| 7,994,958 B2 * | 8/2011 | Quiquempoix | H03M 3/34 341/143 |
| 8,031,098 B1 * | 10/2011 | Ebner | H03M 1/1061 341/144 |
| 8,223,053 B2 * | 7/2012 | Deval | H03M 1/0663 341/143 |
| 8,339,299 B2 * | 12/2012 | Quiquempoix | H03M 1/0663 341/143 |

* cited by examiner

*Primary Examiner* — Jean B Jeanglaude
(74) *Attorney, Agent, or Firm* — John R. Pessetto; Frank D. Cimino

(57) ABSTRACT

A direct current ("DC") calibration reference voltage is applied at an input terminal of an N-level sigma-delta analog-to-digital converter ("ADC"). The ADC includes a current-mode DAC ("I-DAC") operating as a feedback element. A count of logical 1s associated with each of N output levels is taken at outputs of a modulator portion of the ADC during a first mismatch measurement interval. Mismatch measurement logic subsequently transposes pairs of current sources between level selection switch matrices. Doing so causes modulator output error components resulting from mismatches between I-DAC current sources ("delta") to appear as differential level-specific output counts. The mismatch measurement logic compares the differential counts to determine values of delta. The ADC then factors decimated modulator output counts by values of delta in order to correct for the I-DAC current source mismatch(es).

20 Claims, 8 Drawing Sheets

US 9,438,266 B1

CALIBRATED-OUTPUT ANALOG-TO-DIGITAL CONVERTER APPARATUS AND METHODS

TECHNICAL FIELD

Embodiments described herein relate to analog-to-digital conversion, including structures and methods associated with calibration to correct for feedback level mismatch in a multi-bit sigma-delta analog-to-digital converter.

BACKGROUND INFORMATION

Analog-to-digital converters ("ADCs") are an important means of providing inputs from a largely analog natural world to today's largely digital computing environment. One problem with ADC technology is that an ADC necessarily divides an analog input signal into discrete levels or steps capable of being interpreted by a binary computing system. Analog signal magnitude variations which occur between minimum step levels are not captured by the ADC. And, error components result if the ADC generates unequal digital output steps. Consequently, the digital translation of the analog input signal is, generally speaking, inexact.

Technology advances have created a need to translate analog inputs with increasingly finer resolutions. Various ADC circuit architectures such as subranging/pipelined, successive approximation, flash and sigma-delta have been developed to provide resolution/bandwidth trade-offs appropriate to various applications. The sigma-delta ADC can provide very high resolution of relatively low bandwidth signals such as are found in speech applications or even the conversion of near direct current ("DC") telemetry signals.

FIG. 1 is a prior-art block diagram of a sigma-delta ADC 100 including a single-level sigma-delta modulator 105 The modulator 105 oversamples an analog signal appearing at a modulator input terminal 110 at a rate f_s 112. The modulator 105 generates a pulse density modulated pulse stream at an output terminal 115. The ratio of a count of a number of pulses (i.e., a count of a number of binary logical 1's) in the pulse stream divided by a total number of samples clocked during a known interval represents the instantaneous magnitude of the analog signal at the input terminal 110 during the interval. Individual samples of any given point of the input waveform are accumulated over time and averaged by a decimator 120. The decimator 120 generates an ADC output word at a data rate f_d 125 at an output terminal 130.

The sigma-delta modulator 105 includes a comparator 135 which acts as a single-bit quantizer to convert the analog input signal to a one or zero level coarse output at each sampling time. As with any quantizer, the comparator 135 output includes a quantization error. The modulator 105 also includes a single-bit digital-to-analog converter ("DAC") 140 as a negative feedback element. The DAC 140 responds to each transition of the comparator 135 by changing an analog output error signal at an output terminal 143 of a difference amplifier 145. The analog output error signal at the terminal 143 includes quantization noise. The feedback loop operates to drive the error signal to zero such that the output of the DAC 140 becomes equal to the modulator analog input signal at the input terminal 110.

An integrator 150 combined with the sampling strategy outlined above shapes the quantization noise by pushing the noise energy into higher frequency spectra, away from input signal frequencies. Thus, the sigma-delta ADC architecture reduces quantization noise relative to some other architectures.

FIG. 2 is a prior-art block diagram of a sigma-delta ADC 200 including an N-level sigma-delta modulator 205. The N-level modulator 205 encodes $\log_2 N$ binary output bits, typically on N one-hot coded bit output lines. The modulator 205 includes an N-level quantizer 210 rather than the 2-level comparator 135 of FIG. 1. At each sampling time the N-level quantizer 210 resolves the analog signal at its input to one of the N levels and sets the output line corresponding to the resolved level to a binary logical 1 state. The other N−1 output lines not corresponding to the resolved level are set to a binary logical 0 state. The modulator 205 also includes an N-level DAC feedback element 215 rather than the 1-bit, two output-level DAC feedback element 140 of FIG. 1.

The N-level sigma-delta modulator 205 is capable of operation at lower sampling frequencies than the two-level modulator 105 for a given resolution. Alternatively, the N-level modulator 205 provides higher resolution than the 2-level modulator 105 at a given sampling frequency. The dynamic range of the N-level modulator 205 is also greater that of the 2-level modulator 105.

The modulator 205 also includes an $M^{th}$ order loop filter 220 rather than the first-order loop filter of the modulator 105 implemented as a single integrator 150. A higher order loop filter provides a steeper noise shaping, thus pushing more quantization noise into higher frequency bands, away from the desired signal band.

One source of sigma-delta N-level modulator output error components results from unequal analog output steps generated by the N-level feedback DAC. DAC output levels are typically generated using current sources made up of MOS transistors. In practice there is always mismatch between the different current sources due to mismatches in physical dimensions as well as process variations across a die.

SUMMARY OF THE INVENTION

Structures and methods described herein operate to generate a calibrated data output from an N-level sigma-delta ADC. Error components resulting from amplitude mismatches between current sources in a current-mode DAC ("I-DAC") operating as a feedback element in the ADC are eliminated from the ADC output data.

A direct current ("DC") calibration reference voltage ("V_CAL") is applied at an input terminal of a sigma-delta modulator portion of the ADC. A count of binary logical 1 states appearing on each of N level-specific modulator one-hot output terminals is taken during a first mismatch measurement interval. Mismatch measurement logic then transposes pairs of current sources between level selection switch matrices in the I-DAC. Modulator output error components resulting from the mismatch(es) appear in the counts associated with various ones of the N-level specific output terminals as pairs of current sources are transposed between level switch matrices. The mismatch measurement logic compares the differential counts obtained over a series of mismatch measurement intervals to determine magnitudes of current level mismatches ("delta"). The value(s) of delta are then used to factor decimated modulator outputs in order to correct for the I-DAC current source mismatch(es).

Hereinafter, to enhance clarity and generality, the term "modulator output level" shall mean a level-specific binary logical 1 state at a modulator output terminal. It is noted that some embodiments may encode and communicate level-specific states via encodation methods other than one-hot encodation.

DETAILED DESCRIPTION

Figure 1:
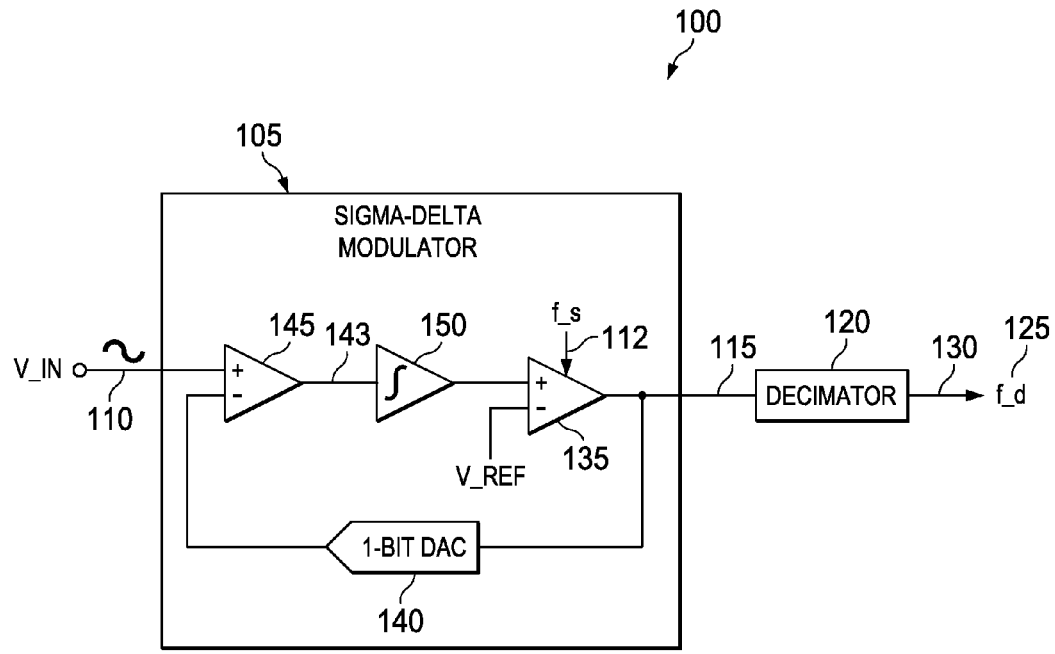
FIG. 1 is a prior-art block diagram of a sigma-delta ADC including a single-level sigma-delta modulator.
Figure 2:
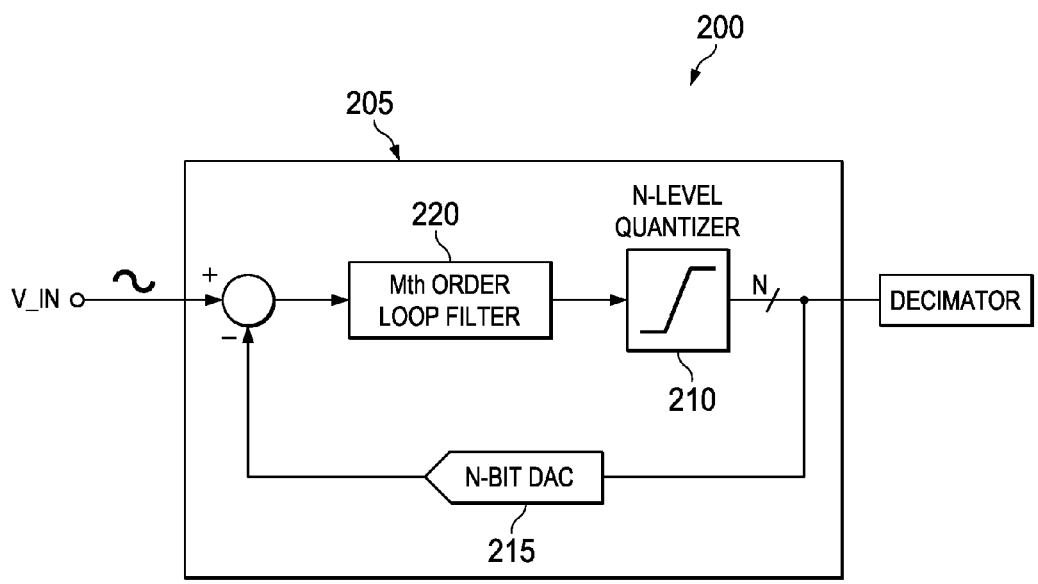
FIG. 2 is a prior-art block diagram of a sigma-delta ADC including an N-level sigma-delta modulator.
Figure 3:
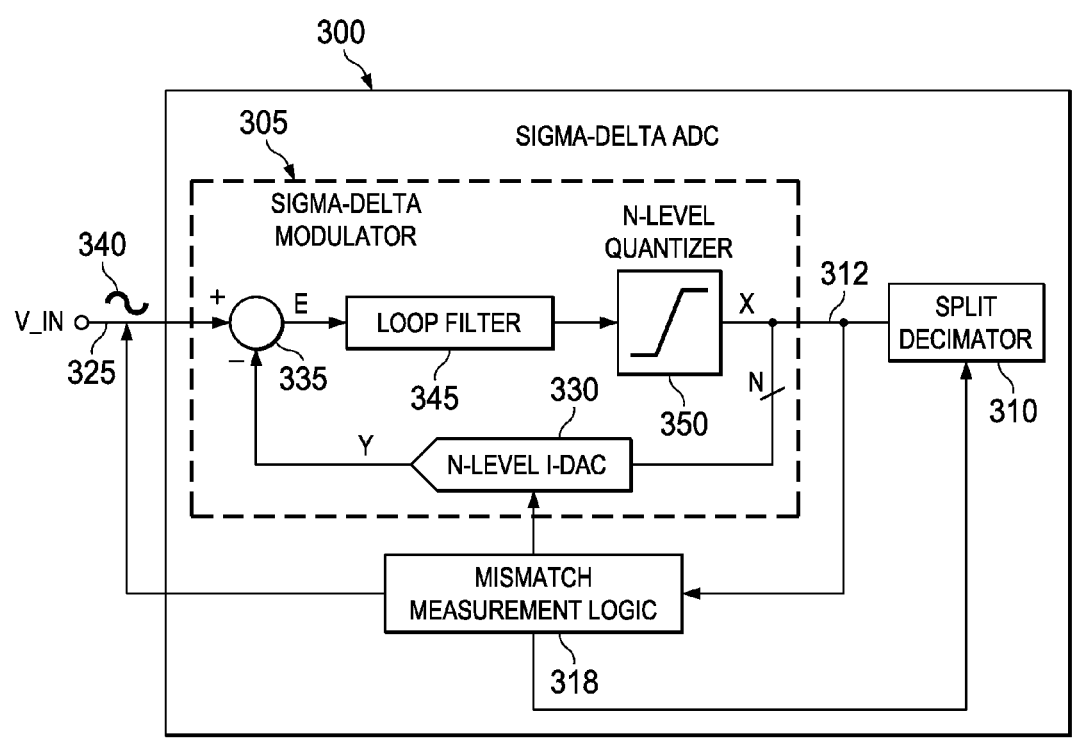
FIG. 3 is a block diagram of a calibrated-output ADC according to various example embodiments of the invention.

FIG. 3 is a block diagram of a calibrated-output ADC 300 according to various example embodiments of the invention. The ADC 300 includes a multi-level sigma-delta modulator 305 and a mismatch-correcting split decimator 310 coupled. The modulator 305 and the split decimator 310 are coupled to one or more output terminals collectively referred to as the output terminals 312. The ADC 300 also includes mismatch measurement logic 318 coupled to the modulator output terminals 312, to a modulator input terminal 325, to the N-level I-DAC 330 and to the split decimator 310.

The modulator 305 includes an N-level I-DAC 330 coupled to the modulator output terminals 312. N is a positive integer greater than or equal to five and not evenly divisible by two. That is, the integer 2 is an aliquant to N. The I-DAC 330 provides a negative feedback loop in the modulator 305 and is implemented with (N−1)/2 switched current sources as described in detail below. The modulator 305 also includes a difference amplifier 335. A positive terminal of the difference amplifier 335 is coupled to the modulator input terminal 325. A negative terminal of the difference amplifier 335 is communicatively coupled to an output terminal of the I-DAC 330. The difference amplifier 335 combines an input signal 340 with a negative feedback signal from the I-DAC 330.

The modulator 305 also includes a loop filter 345 coupled to an output terminal of the difference amplifier 335. The loop filter 345 creates a high pass response in the noise transfer function (NTF) of the modulator 305. The NTF is the frequency response seen by the quantization noise introduced by the N-level quantizer 350. The loop filter 345 pushes quantization noise components into higher frequencies, away from the input signal bandwidth. Some embodiments may utilize a higher-order filter to implement the loop filter 345. The modulator 305 further includes an N-level quantizer 350 coupled between an output terminal of the loop filter 345 and output terminals 312 of the modulator 305. The number of levels N of the quantizer 350 is equal to the number of possible analog levels generated by the I-DAC 330.

The mismatch measurement logic 318 determines magnitudes of [(N−1)/2−1] mismatch errors ("$\delta 1$", "$\delta 2$" ... "$\delta\_[(N-1)/2-1]$") (collectively, "delta"). The delta mismatch errors are determined from counts of occurrences of modulator output levels during (N−1)/2 mismatch measurement intervals. A reference voltage ("V_CAL") is applied to the input terminal 325 during each mismatch measurement interval. Each mismatch error corresponds to a difference in amplitude of currents from each of a set of two of the (N−1)/2 switched current sources in the I-DAC 330 as mentioned above and as further described below. A first count of occurrences of each modulator output level is taken during a first mismatch measurement interval. Current sources in the I-DAC 330 are each connected to a corresponding level selection switch matrix in a standard configuration during the first mismatch measurement interval, as further described in detail below. The two current sources whose mismatch is being measured are transposed in the circuit of the I-DAC 330 prior to each mismatch measurement interval following the first mismatch measurement interval.

The mismatch-correcting split decimator 310 applies a decimation filtering to output data from the modulator 305 in order to generate an uncorrected ADC output data component D_UNCORRECTED. The split decimator 310 also decimates counts of occurrences of [(N−1)/2−1] subsets of modulator output levels predetermined to be delta-influenced, as further described below. The decimator 310 then multiplies the decimated counts of the delta-influenced subsets by a predetermined factor of one or more of $\delta 1$, $\delta 2$ ... $\delta\_[(N-1)/2-1]$. Doing so generates an ADC output data error component {E_OUT1, E_OUT2 ... E_OUT_[(N−1)/2−]} corresponding to each subset of delta-influenced output levels. The decimator 310 then sums the resulting [(N−1)/2−1] ADC output data error components with the uncorrected ADC output data component to generate a calibrated ADC output data stream D_CALIBRATED, corrected for $\delta 1$, $\delta 2$ ... $\delta\_[(N-1)/2-1]$:

$$D\_CALIBRATED = D\_UNCORRECTED + E\_OUT1 + E\_OUT2 + E\_OUT\_[(N-1)/2-1].$$

Figure 4:
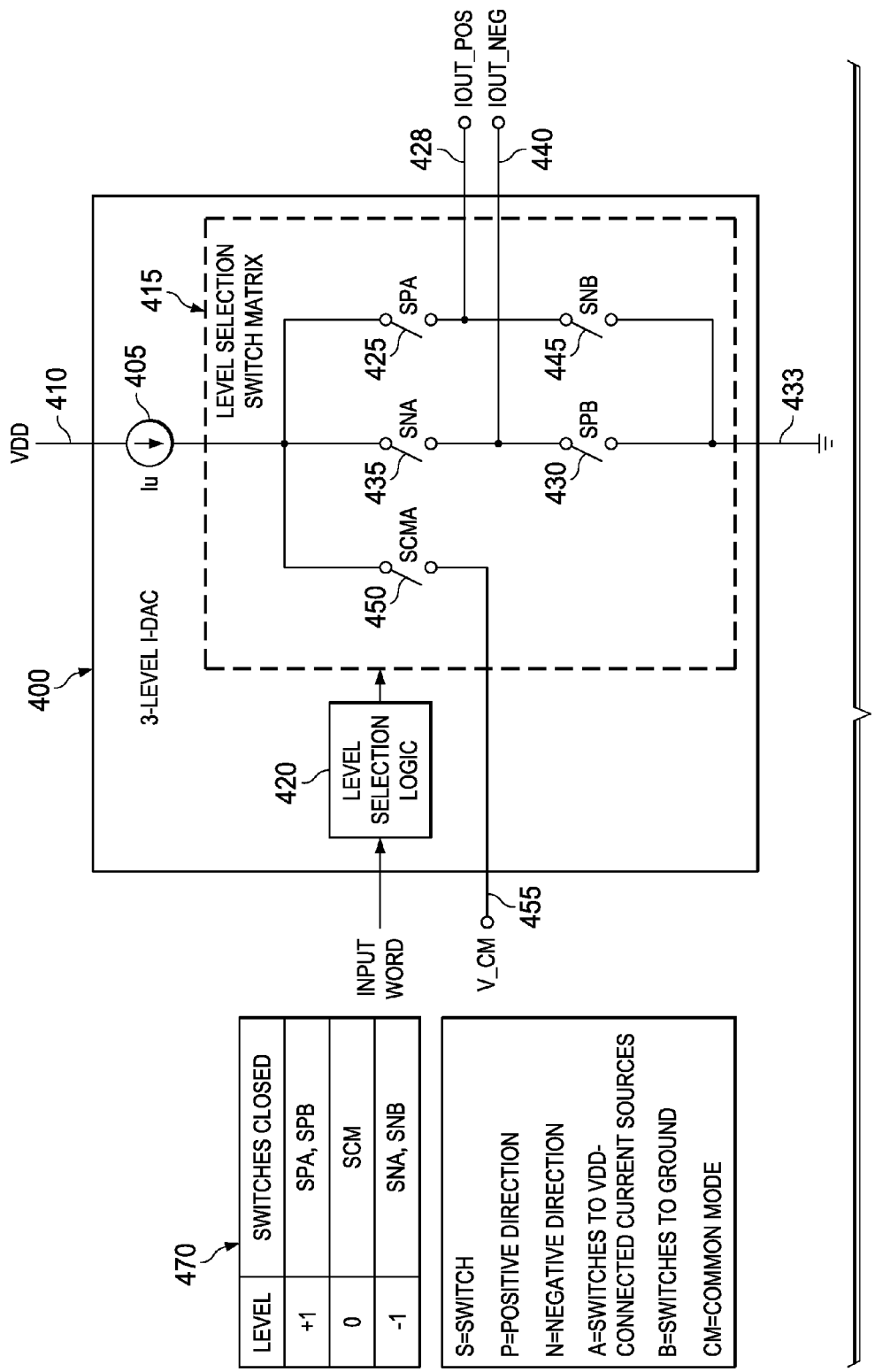
FIG. 4 is a schematic diagram of a 3-level I-DAC ADC feedback element associates with a calibrated-output ADC according to various example embodiments.

FIG. 4 is a schematic diagram of a 3-level I-DAC feedback element 400 according to various example embodiments. The 3-level I-DAC 400 is an example of a most basic N-level DAC implemented with switched current sources. In this example case, the I-DAC 400 implements the unit current levels −1, 0 and +1. The N-level I-DAC 330 of the calibrated output sigma-delta ADC 300 of FIG. 3 includes (N−1)/2 units of the 3-level I-DAC 400 coupled in parallel with each other.

The I-DAC 400 includes a switched current source 405 coupled to a voltage rail 410. The I-DAC 400 also includes a level selection switch matrix 415 coupled to the switched current source 405. States of switches in the level selection switch matrix 415 determine the level and direction of current flowing at positive and negative output terminals IOUT_POS 428 and IOUT_NEG 440, respectively. The I-DAC 400 further includes level selection logic 420 coupled to the level selection switch matrix 415. The level selection logic 420 receives a data input word and controls the output state of the 3-level I-DAC unit according to the input word by switching the output terminals 428 and 440 to the switched current source 405.

The example level selection switch matrix 415 includes a first switch 425 coupled between the switched current source 405 and the positive output terminal 428. The switch matrix 415 also includes a second switch 430 coupled between the negative output terminal 440 and a ground terminal 433 to provide a return for current with the I-DAC 400 in the +1 state. A third switch 435 is coupled between the switched current source 405 and the negative output terminal 440 to provide current flow outward from the negative terminal 440 to implement the −1 state. A fourth switch 445 is coupled between the positive output terminal 428 and the ground terminal 433 to provide a return for −1 state current. A fifth switch 450 is coupled between the switched current source 405 and a common-mode terminal 455. The common-mode terminal 455 prevents the current source from floating when disconnected from both output terminals at level state 0. The table 470 associates switch states of the switch matrix 415 with I-DAC output levels as described.

Figure 5:
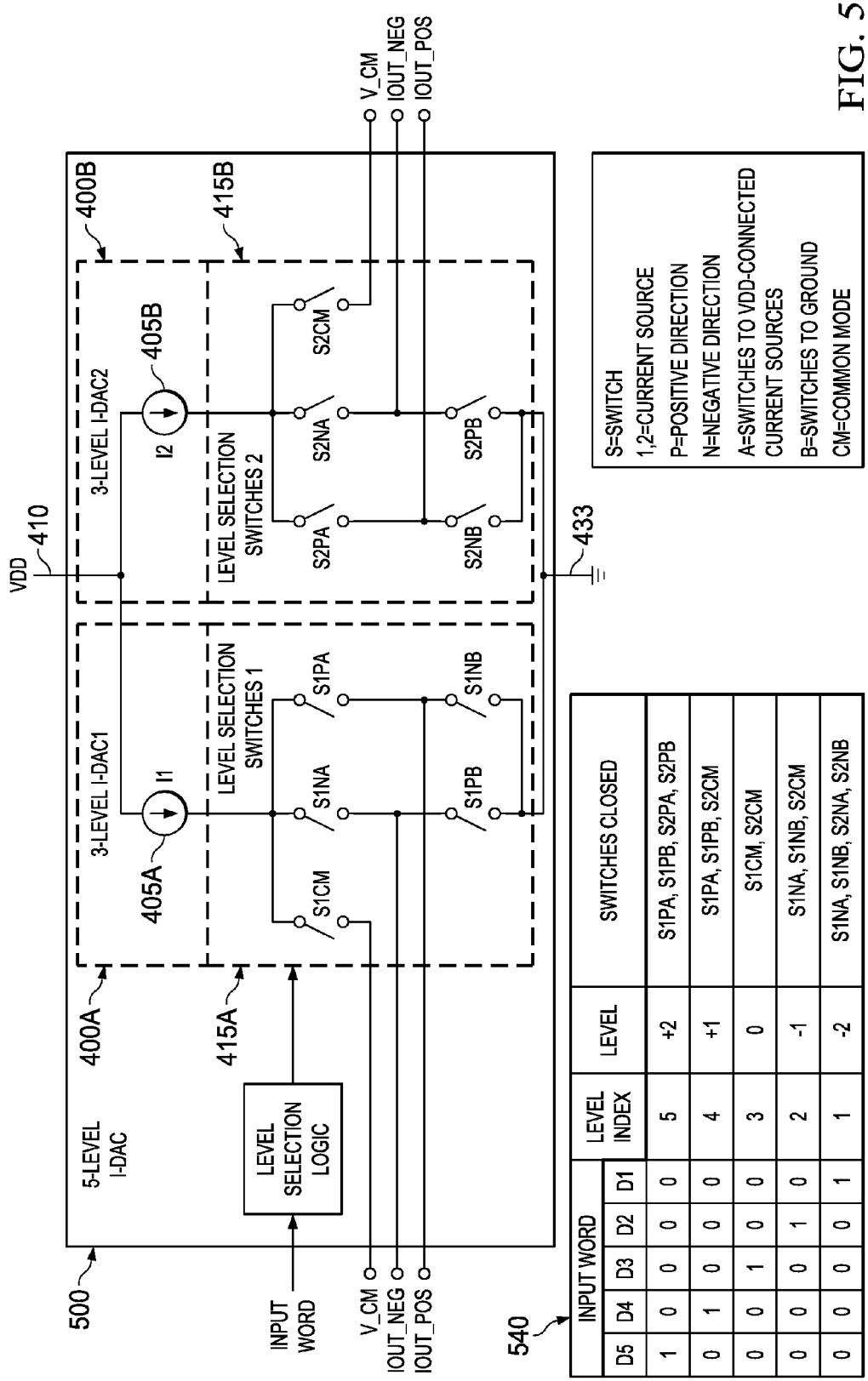
FIG. 5 is a schematic diagram of a 5-level I-DAC ADC feedback element associated with a calibrated-output ADC according to various example embodiments.

FIG. 5 is a schematic diagram of a 5-level I-DAC ADC feedback element 500 according to various example embodiments. The 5-level I-DAC 500 includes two of the 3-level I-DACs 400 of FIG. 4 configured in parallel. That is, the I-DAC 500 includes 3-level I-DACs 400A and 400B. The switched current sources 405A of I-DAC 400A and 405B of I-DAC 400B are connected in parallel between the voltage rail 410 and their respective level selection switch matrices 415A and 415B, and then to the ground rail 433. Table 540 associates each of the five output levels (−2, −1, 0, +1, +2) with a corresponding input word and the corresponding states of the level selection switches of the switch matrices 415A and 415B.

The mismatch measurement logic 318, described in detail below, transposes the current sources 405A and 405B between their respective level selection switch matrices 415A and 415B. Doing so causes the modulator output error components to be reflected in different output levels (e.g., a particular subset of the levels −2, −1, 0, +1, +2) as the current sources 405A and 405B are transposed between the level switch matrices 415A and 415B. The described embodiments compare the differential counts of the output levels from the modulator to determine the actual current level difference, delta, between the current sources 405A and 405B (M, in the case of a 5-level modulator, or δ1, δ2 . . . δ_[(N−1)/2−1] in the case of an N-level modulator). The value(s) of delta are then used to factor decimated modulator outputs in order to correct for the I-DAC current source mismatch(es).

Figure 6:
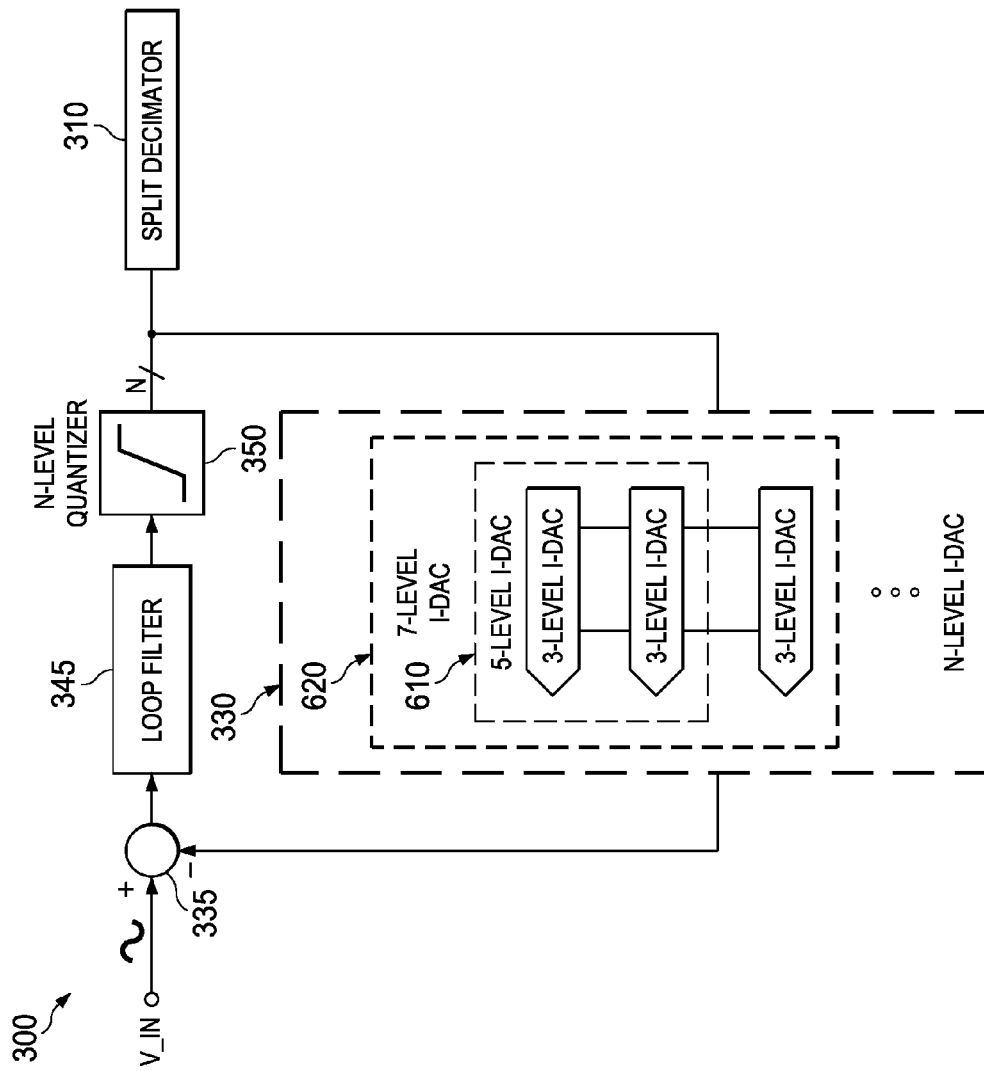
FIG. 6 is a partial block diagram of a calibrated-output ADC including an N-level I-DAC feedback element in a sigma-delta modulator according to various example embodiments.

FIG. 6 is a partial block diagram of a calibrated-output ADC including an N-level I-DAC feedback element 330 in a sigma-delta modulator portion of the ADC according to various example embodiments. The number of analog output levels of which the N-level I-DAC 330 is capable is determined by the number of 3-level I-DACs (e.g., the 3-level I-DAC of FIG. 4) configured in parallel, as previously described. Thus, for example, a 5-level I-DAC 610 is configured with two 3-level I-DACs as previously described with reference to FIG. 5. A 7-level I-DAC 620 is configured with three 3-level I-DACs. More generally, the N-level I-DAC 330 is configured with (N−1)/2 3-level I-DACs, where N is a positive integer equal to or greater than five and not evenly divided by two.

Turning back now to FIG. 3, N-level digital data X appears at the output terminals 312 of the modulator 305 at a sampling rate F_S. The sigma-delta ADC 300 is over-sampled, thus F_S is much greater than the rate of change of the input waveform 340 applied to the input terminal 325. Ideally, an average of a sum of a count of each output level over an averaging period AP, weighted by the magnitude of each output level ("L"), is equal to an instantaneous magnitude of the input waveform 340. During the averaging period AP, a number of pulses Q=F_S*AP appear at the output terminals 312. Consider now a 5-level sigma-delta modulator example with logic levels as described with respect to FIG. 5. Using i as an index into the set of Q pulses, the ideal output of the ADC 300 is equal to the instantaneous modulator input during the averaging period AP:

$$X\_AVG = \left[2*\sum_{i=1}^{Q} L5(i) + \sum_{i=1}^{Q} L4(i) - \sum_{i=1}^{Q} L2(i) - 2*\sum_{i=1}^{Q} L1(i)\right]\Big/Q =$$

V_IN(INSTANTANEOUS)

Let us express the individual level counts during the averaging period for the 5-level example as (+2, level 5 counts=A5), (+1, level 4 counts=A4), (level 3 is the zero level and is therefor not counted), (−1, level 2 counts=A2) and (−2, level 1 counts=A1). X_AVG may then be expressed as:

$X\_AVG=(2*A5+A4-A2-2*A1)/Q$

However, error components from the mismatch appear at the output of the modulator 305 with the result that X_AVG is not equal to V_IN(INSTANTANEOUS) in the real-world case. The X output error components appear as average differences in the actual level counts from the level counts that would be generated by the modulator 305 in the absence of the I-DAC current source mismatch.

Because mismatch within the I-DAC 330 is responsible for the X term output errors, analog output data Y of the I-DAC 330 includes the magnitude(s) delta of the mismatch errors. Although actually analog in nature, Y can be viewed in terms of an average of its output levels over the averaging period AP by factoring each level by the corresponding count A5, A4, A2, or A1 appearing at the modulator output X, summing the factors, and dividing the result by Q. For the ideal case, disregarding mismatch:

$Y\_AVG=(2*A5+A4-A2-2*A1)/Q$

Referring again to FIG. 5, it is noted that switched current sources 405A and 405B are "unit current" sources. That is, ideally the magnitudes of current generated by each are equal. In reality, however, component tolerances, temperature variations, and other factors result in a current mismatch δ1 between current sources 405A and 405B. From the table 540 of FIG. 5, L5=I1+I2, L4=I1, L3=zero, L2=−I1, and L1=−(I1+I2). The mismatch error delta has been defined as a magnitude of the difference between currents from the I-DAC current sources, or δ1=I1−I2. In terms of a "unit current" I, I2=I and I1=I+δ1. Considering mismatch error, the five current levels can be expressed in terms of unit current as: L5=2I+δ1, L4=I+δ1, L2=−(I+δ1) and L1=−(2I+δ1). The average I-DAC Y output data, with the five levels factored for mismatch and factored by equivalent X-output level count over the averaging period AP is:

$Y\_AVG=(2+δ1)*A5+(1+δ1)*A4-(1+δ1)*A2-(2+δ1)*A1)/Q$

Referring again back to FIG. 3, the negative feedback loop formed by components of the sigma-delta modulator 305 causes the error output E of the difference amplifier 335 to be driven to zero. Therefor, Y_AVG is equal to the instantaneous value of the input signal 340 at the input terminal 325. It is noted that components of δ1 can be thought of as being "driven" by the modulator loop to counts of particular output levels in the output pulse stream X.

The mismatch measurement logic 318 applies the reference voltage V_CAL to the input terminal 325 during each mismatch measurement interval as previously described. Thus, with the I-DAC 330 reset to the operational configuration, during the first measurement interval:

$$V\_CAL=Y\_AVG=(2+\delta1)*A5+(1+\delta1)*A4-(1+\delta1) *A2-(2+\delta1)*A1)/Q \quad (1)$$

After transposing I1 and I2, the five current levels are: L5=I1+I2, L4=I2, L3=zero, L2=−I2, and L1=−(I1+I2). Considering mismatch error, the five levels can be expressed in terms of unit current after transposing current sources as: L5=2I+δ1, L4=I, L2=−I) and L1=−2(I+δ1). Thus, with the current sources of the I-DAC 330 transposed, in terms of the set of level counts {B} seen in the pulse stream X during the second measurement interval:

$$V\_CAL=(2+\delta1)*B5+B4-B2-(1+\delta1)*B1)/Q \quad (2)$$

Solving the simultaneous equations (1) and (2) for δ1 yields:

$$\delta1=[(2A5+A4-A2-2A1)-(2B5+B4-B2-2B1)]/(A5+ A4-A2-A1-B5-B1)$$

The current source mismatch error δ1 associated with a 5-level embodiment of the ADC apparatus described herein is calculated from the predetermined algebraic function of the sets of counts {A} and {B} as described immediately above.

I-DAC current source mismatch errors δ1, δ2 ... δ_[(N−1)/2−1] associated with an N-level sigma-delta modulator are determined by the disclosed embodiments in similar fashion as described here above for the 5-level example case. For example, two pairs of the three current sources associated with a 7-level modulator are sequentially transposed and sets of modulator output level counts {A}, {B} and {C} are taken during first, second and third measurement intervals. Counts for each level from each of the sets of counts {A}, {B} and {C} are substituted into two predetermined algebraic functions of {A}, {B} and {C} to determine δ1 and δ2.

Figure 7:
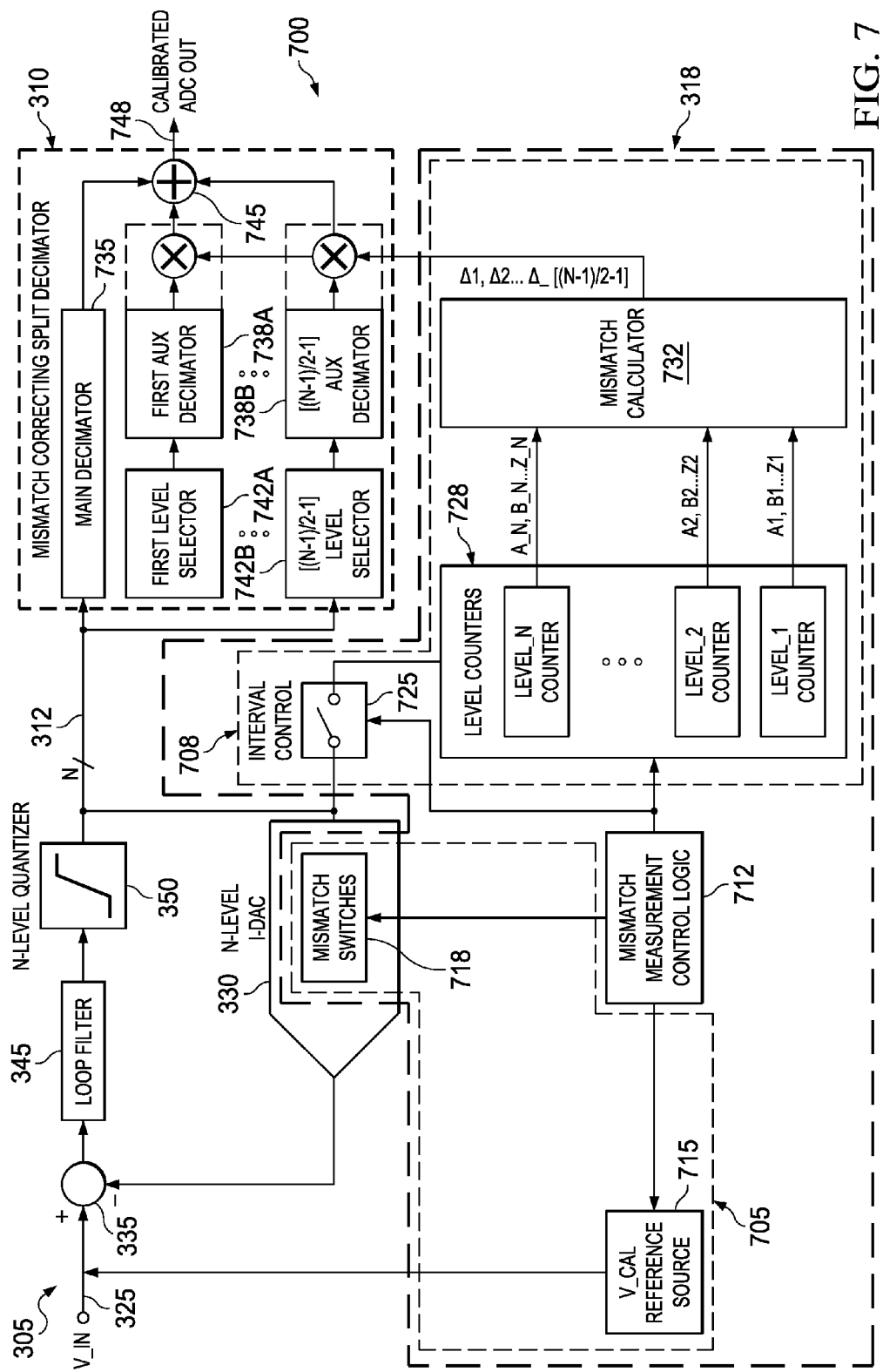
FIG. 7 is a detailed block diagram of a calibrated-output ADC according to various example embodiments.

FIG. 7 is a detailed block diagram of a calibrated-output ADC 700 according to various example embodiments. Like the ADC 300 of FIG. 3, the ADC 700 includes an N-level sigma-delta modulator 305, a mismatch-correcting split decimator 310 and mismatch measurement logic 318. The modulator 305 includes an N-level I-DAC 330, a difference amplifier 335, a loop filter 345 and an N-level quantizer 350, all as previously described with reference to FIG. 3.

The mismatch measurement logic 318 of the ADC 700 includes a mismatch measurement input section 705 coupled to the modulator input terminal 325, a mismatch calculation section 708 coupled to the modulator output terminals 312, and mismatch measurement control logic 712 coupled to the mismatch measurement input section 705 and to the mismatch calculation section 708. The mismatch measurement input section 705 establishes a calibration voltage V_CAL at the modulator input terminal 325. The mismatch measurement input section 705 also assigns I-DAC current sources (e.g., the current sources 405A and 405B of FIG. 5) to level selection switch matrices (e.g., to the switch matrices 415A and 415B of FIG. 5) prior to each mismatch measurement interval. The mismatch calculation section 708 determines δ1, δ2 . . . δ_[(N−1)/2−1] as further described in detail below. The mismatch measurement control logic 712 controls structures within the mismatch measurement logic 318 in order to execute sequences associated with the mismatch measurement process.

The mismatch measurement input section 705 also includes a calibration voltage source 715 coupled to the modulator input terminal 325. The voltage source 715 generates V_CAL. The mismatch measurement input section 705 further includes a mismatch measurement switch matrix component 718 of the I-DAC 330.

Figure 8:
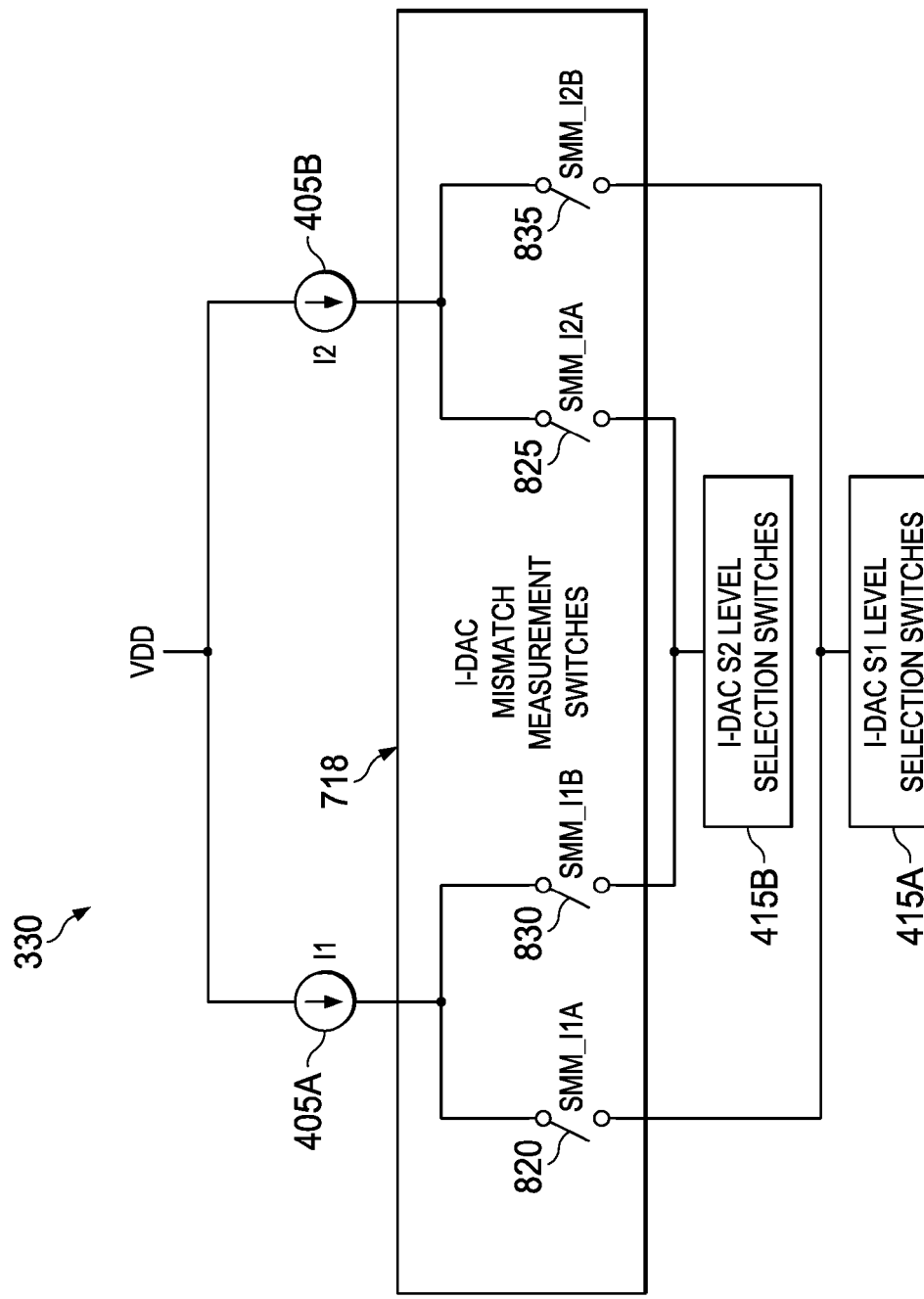
FIG. 8 is a schematic diagram an N-level I-DAC ADC feedback element including a mismatch measurement switch matrix according to various example embodiments.

FIG. 8 is a schematic diagram of the N-level I-DAC ADC feedback element 330 including the mismatch measurement switch matrix 718 according to various example embodiments. The measurement switch matrix 718 transposes a pair of switched current sources (e.g., the switched current sources 405A and 405B of FIG. 5) relative to an operational configuration. In the context of the N-level I-DAC 330, "operational configuration" means a predetermined assignment of each of (N−1)/2 switched current sources to one of (N−1)/2 level selection switch matrices. The operational configuration is used during normal operation of the ADC. Additionally, mismatch measurements are taken during a mismatch measurement interval following a reset of the I-DAC to the operational configuration at the beginning of a mismatch measurement sequence.

The measurement switch matrix 718 transposes a pair of switched current sources (e.g., the switched current sources 405A and 405B) by reassigning each current source of the pair to a level selection switch matrix (e.g., the level selection switch matrices 415A and 415B) assigned to the other current source in the operational configuration. For I-DACs with greater than two current sources, successive pairs of switched current sources are transposed prior to each mismatch measurement interval following the first mismatch measurement interval.

Considering an example sequence in light of FIG. 8 and the 5-level I-DAC of FIG. 5, the mismatch measurement switch matrix 718 may be reset to an operational configuration prior to a first mismatch measurement interval. The operational configuration may be implemented by closing a switch 820 in order to connect the switched current source 405A to level selection switch matrix 415A and by closing a switch 825 in order to connect the switched current source 405B to level selection switch matrix 415B. The mismatch measurement switch matrix 718 transposes current sources 405A and 405B prior to a second mismatch measurement interval. It does so by opening switches 820 and 825 and by closing switch 830 in order to connect the switched current source 405A to level selection switch matrix 415B and by closing switch 835 in order to connect the switched current source 405B to level selection switch matrix 415A.

It is noted that the transposition of current source pairs within the N-level I-DAC 330 is conceptualized herein using the example of the mismatch measurement switch matrix 718. However, some embodiments of the mismatch measurement logic 318 may transpose pairs of I-DAC current sources by exercising control over the I-DAC level selection switch matrices themselves (e.g., the switch matrices 415A and 415B of FIG. 5) and thus eliminate a need for the mismatch measurement switch matrix 718.

The mismatch calculation section 708 of the mismatch measurement logic 318 further includes interval control logic 725 coupled to the output terminals 312 of the modulator 305. The interval control logic 725 provide mismatch measurement access to modulator output levels during mismatch measurement intervals.

The mismatch calculation section 708 also includes a set of level counters 728 coupled to the interval control logic 725. Each of the level counters 728 counts the number of occurrences of the level to which it is assigned during a measurement interval. The level counters 728 thus count a first number of occurrences of each modulator output level during a first mismatch measurement interval in order to generate a first set of counts {A}=A1, A2 . . . A_N. The set of level counters 728 subsequently count a second number of occurrences of each modulator output level during a second mismatch measurement interval in order to generate a second set of counts {B}=B1, B2 . . . B_N. The second measurement interval occurs after a first pair of (N−1)/2 I-DAC current sources in the modulator feedback loop are transposed, as previously described. The set of level counters 728 subsequently count a number of occurrences of each modulator output level during an $(N-1)/2^{th}$ mismatch measurement interval in order to generate a $(N-1)/2^{th}$ set of counts {Z}=Z1, Z2 . . . Z_N. The $(N-1)/2^{th}$ mismatch measurement interval occurs after interchanging an $[(N-1)/2-1]^{th}$ pair of the (N−1)/2 I-DAC current sources in the modulator feedback loop.

The mismatch calculation section 708 further includes a mismatch calculator 732 coupled to the level counters 728. The mismatch calculator 732 calculates each of δ1, δ2 . . . δ_[(N−1)/2−1] as a predetermined algebraic function of {A}, {B} . . . {Z}. The algebraic function(s) result from V_CAL being equal to an average of each set of counts after each count is weighted by an amount equal to the level corresponding to the count as previously described. The previous description considers that each set of counts includes a delta mismatch component proportional to each of δ1, δ2 . . . δ_[(N−1)/2−1] (collectively "delta"). That is, V_CAL=AVG {A_WEIGHTED}(δ)=AVG_ {B_WEIGHTED}(δ) . . . =AVG_{Z_WEIGHTED}(δ).

Having determined the current source mismatches δ1, δ2 . . . δ_[(N−1)/2−1], embodiments of the ADC reset the current source-to-level switch matrix assignments of the I-DAC 330 to the operational configuration as previously described. For the 5-level modulator case, level assignments in the operational configuration are as indicated in the table 540 of FIG. 5. L5=I1+I2, L4=I1, L3=zero, L2=−I1, and L1=−(I1+I2).

The mismatch-correcting split decimator 310 of the ADC 700 of FIG. 7 includes a main decimator 735 coupled to the modulator output terminals 312. The main decimator 735 generates an uncorrected ADC output data component as previously mentioned. To do so, the main decimator 735 applies a decimation filtering to a weighted sum of occurrences of each of the N modulator output levels at sampling times during a decimation interval DI. The count of occurrences of each output level is weighted by a magnitude of the particular output level. Using the example levels previously introduced for a 5-level modulator, for example, level 1 is weighted by −2, level 2 is weighted by −1, level 3 is zero, level 4 is weighted by +1 and level 5 is weighted by +2. Accordingly, the main decimator 735 applies the decimation filtering to the overall sum of the weighted sum of each count taken during the decimation interval DI:

$$2*\sum_{i=1}^{S} D5(i) + \sum_{i=1}^{S} D4(i) - \sum_{i=1}^{S} D2(i) - 2*\sum_{i=1}^{S} D1(i),$$

where S=total samples taken during DI

The resulting output of the main decimator 735 is the uncorrected ADC output data component D_UNCORRECTED.

The split decimator 310 also includes a number [(N−1)/2−1] of auxiliary decimators (e.g., the auxiliary decimators 738A and 738B) communicatively coupled to the modulator output terminals 312. Each auxiliary decimator applies the decimation filtering at sampling times during the decimation interval to a sum of occurrences of a subset of modulator output levels. The subset of output levels is predetermined to be influenced by one or more delta mismatch component. An example of terms for a single auxiliary decimator 738A applicable to a 5-level modulator follows from the previous discussion of the mismatch measurement logic 318. The output Y of the I-DAC 330, expressed in level counts D5, D4, D2 and D1 over the decimation interval DI and factored for the mismatch δ1 is:

$$Y\_DI=(2+δ1)*D5+(1+δ1)*D4-(1+δ1)*D2-(2+δ1)*D1).$$

That is, the mismatch term δ1 appears in the counts of all non-zero levels. However, Y_DI may be normalized to exclude δ1 from the peak positive and negative I-DAC levels expressed as counts D5 and D1, respectively. Thus normalized, Y_DI=2*D5+(1+0.5*δ1)*D4−(1+0.5*δ1)*D2−2*D1). Accordingly, the modulator output level counts requiring correction are limited to level counts D4 and D2.

The mismatch correcting split decimator 310 includes one or more output level selectors (e.g., the level selectors 742A and 742B) coupled between the modulator output terminals 312 and each auxiliary decimator (e.g., the auxiliary decimators 738A and 738B). The level selector(s) select the delta-influenced output levels corresponding to each auxiliary decimator. For the example 5-level modulator discussed immediately above, the level selector 742A selects levels 4 and 2 for auxiliary decimation. The auxiliary decimator 738A applies the decimation filtering to the sum of counts (D4−D2) in order to generate a decimated delta-influenced output data component.

Each auxiliary decimator subsequently multiplies the resulting decimated delta-influenced output data component by a predetermined factor of one or more of δ1, δ2 . . . δ_[(N−1)/2−1] in order to generate one of [(N−1)/2−(1)] ADC output data error components E_OUT. For the 5-level example embodiment of the mismatch-correcting ADC 700, the auxiliary decimator multiplies the decimated M-influenced term (D4−D2) by 0.5*δ1 in order to generate a single output data error component E_OUT.

The split decimator 310 also includes a summing junction 745 coupled to an output terminal of the main decimator and to output terminals of the auxiliary decimator(s). The summing junction adds the [(N−1)/2−(1)] ADC output data error components E_OUT from each auxiliary decimator to the uncorrected ADC output data component D_UNCORRECTED from the main decimator. The result, appearing at output terminal(s) of the summing junction, is calibrated ADC output data D_CALIBRATED corrected for δ1, δ2 . . . δ_[(N−1)/2−(1)]:

$$D\_CALIBRATED=D\_UNCORRECTED+E\_OUT1+E\_OUT2+E\_OUT\_[(N-1)/2-1].$$

Figure 9:
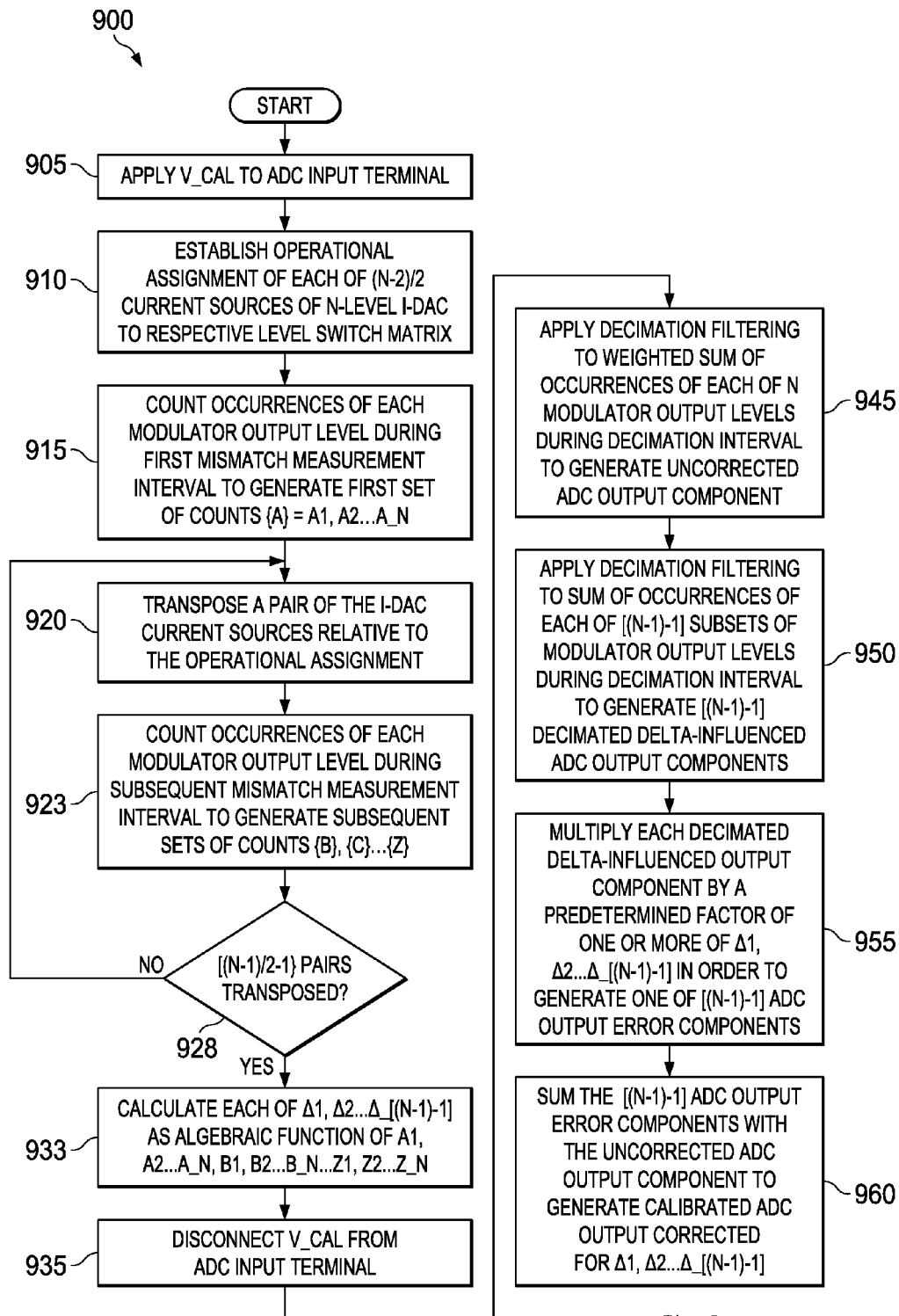
FIG. 9 is a flow diagram of method of generating a calibrated output from an N-level sigma-delta ADC according to various example sequences.

FIG. 9 is a flow diagram of method 900 of generating a calibrated output from an N-level sigma-delta ADC according to various example sequences. The method 900 includes counting occurrences of voltage levels at output terminals of a sigma-delta modulator portion of the ADC during a series of mismatch measurement intervals. Each mismatch interval is associated with one of (N−1)/2 configurations of an N-level current mode I-DAC negative feedback element associated with the modulator. The method 900 includes determining an amplitude mismatch ("delta") between one or more pairs of [(N−1)/2−(1)] current sources in the I-DAC from the counts of occurrences of the modulator output voltage levels. The method 900 also includes applying a decimation filtering to output data from the modulator to generate an uncorrected ADC output data component during normal operation of the ADC. The method 900 further includes multiplying decimated modulator output levels predetermined to be delta-influenced by a predetermined factor of delta in order to generate one or more ADC output data error components. The method 900 terminates with summing the ADC output data error components with the uncorrected ADC output data component to generate calibrated ADC output data corrected for delta.

The method 900 commences at block 905 with applying a reference voltage V_CAL to an input terminal of the ADC during (N−1)/2 mismatch measurement intervals. The method 900 continues at block 910 with establishing an operational assignment of each of (N−1)/2 switched current sources to one of (N−1)/2 level selection switch matrices within the N-level I-DAC. The operational assignment determines a contribution of the current from each switched current source to each of the N modulator output levels.

The method 900 includes counting a number of occurrences of each modulator output level at the modulator output terminals at sampling times during a first mismatch measurement interval, at block 915. Doing so generates a first set of counts {A}=A1, A2 . . . A_N. The method 900 continues with transposing one of [(N−1)/2−(1)] pairs of the switched current sources relative to the operational assignment, at block 920. The method 900 also includes counting a number of occurrences of each modulator output level during a subsequent mismatch measurement interval following each transposition of a pair of switched current sources in order to generate a subsequent set of counts (e.g., {B}=B1, B2 . . . B_N, {C}=C1, C2 . . . C_N . . . {Z}=Z1, Z2 . . . Z_N), at block 923. It is noted that modulator output data errors resulting from amplitude mismatches δ1, δδ2 . . . δ_[(N−1)/2−(1)] (collectively, "delta") between transposed current sources appear in counts associated with predetermined modulator output levels during each mismatch measurement interval. The method 900 includes determining whether [(N−1)/2−(1)] current source pairs have been transposed, at block 928. If not, the method 900 loops back to block 920 to transpose another current source pair.

Once the [(N−1)/2−(1)] current source pairs have been transposed and the resulting modulator output level counts taken, the method 900 continues at block 933 with calculating each of δ1, δ2 . . . δ_[(N−1)/2−(1)] as an algebraic function of A1, A2 . . . A_N, B1, B2 . . . B_N, C1, C2 . . . C_N . . . Z1, Z2 . . . Z_N. Each algebraic function results from V_CAL being equal to an average of each set of counts after each count is weighted by an amount equal to the level corresponding to the count (V_CAL=AVG_{A_WEIGHTED}(δ)=AVG_{B_WEIGHTED}(δ) . . . =AVG_{Z_WEIGHTED}(δ)). The method 900 also includes disconnecting V_CAL from the ADC input terminal following the above described mismatch measurement operations, at block 935.

The method 900 proceeds at block 945 with applying a decimation filtering to a weighted sum of occurrences of each of the N modulator output levels at sampling times during a decimation interval. Doing so generates an uncorrected ADC output data component. A count of occurrences of each output level is weighted by a magnitude of the corresponding level.

The method 900 includes selecting the [(N−1)/2−(1)] subsets of modulator output levels predetermined to be influenced by one or more of the delta mismatch components δ1, δ2 . . . δ_[(N−1)/2−(1)]. The method 900 also includes applying a decimation filtering to a sum of occurrences of each of the [(N−1)/2−(1)] subsets of modulator output levels at sampling times during the decimation interval, at block 950. Decimation filtering of the subsets of levels generates [(N−1)/2−(1)] decimated delta-influenced output data components. The method 900 further includes multiplying each decimated delta-influenced output data component by a predetermined factor of one or more of δ1, δ2 . . . δ_[(N−1)/2−1], at block 955. Doing so generates [(N−1)/2−(1)] ADC output data error components.

The method 900 terminates at block 960 by summing the [(N−1)/2−(1)] ADC output data error components with the uncorrected ADC output data component in order to generate calibrated ADC output data corrected for δ1, δ2 . . . δ_[(N−1)/2−(1)].

Apparatus and methods described herein may be useful in applications other than generating a calibrated output from an N-level sigma-delta ADC. The examples of the calibrated output ADC 300 and 700, the 3-level I-DAC 400, the 5-level I-DAC 500 and the method 900 described herein are intended to provide a general understanding of the structures of various embodiments and the sequences of various methods. They are not intended to serve as complete descriptions of all elements and features of apparatus, systems and methods that might make use of these example structures and sequences.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A calibrated-output analog-to-digital converter ("ADC"), comprising:
   a multi-level sigma-delta modulator including an N-level current-mode digital-to-analog converter ("I-DAC") coupled to at least one output terminal of the modulator to provide a negative feedback loop in the modulator, the I-DAC implemented with (N−1)/2 switched current sources;
   mismatch measurement logic coupled between a modulator input terminal and the modulator output terminals to determine, from counts of occurrences of modulator output levels during (N−1)/2 mismatch measurement intervals, magnitudes of [(N−1)/2−1] mismatch errors ("δ1", "δ2" . . . "δ_[(N−1)/2−1]") (collectively, "delta"), each mismatch error corresponding to a difference in amplitude of currents from each of a set of two of the (N−1)/2 switched current sources transposed prior to each mismatch measurement interval following a first mismatch measurement interval; and
   a mismatch-correcting split decimator coupled to the modulator output terminals to apply a decimation filtering to output data from the sigma-delta modulator in order to generate an uncorrected ADC output data component, to multiply decimated counts of modulator output levels predetermined to be delta-influenced by a predetermined factor of at least one of δ1, δ2 . . . δ_[(N−1)/2−1] in order to generate at least one ADC output error component, and to sum the ADC output error components with the uncorrected ADC output data component to generate a calibrated ADC output data component corrected for δ1, δ2 . . . δ_[(N−1)/2−1].

2. The ADC of claim 1, the multi-level sigma-delta modulator further comprising:
   a difference amplifier component of the sigma-delta modulator, a positive terminal of the difference amplifier coupled to the modulator input terminal and a negative terminal communicatively coupled to an I-DAC output terminal, the difference amplifier to combine an input signal with a negative feedback signal from the I-DAC.

3. The ADC of claim 2, the multi-level sigma-delta modulator further comprising:
   a loop filter coupled to an output terminal of the difference amplifier; and
   an N-level quantizer coupled between an output terminal of the loop filter and the modulator output terminals.

4. The ADC of claim 1, the N-level I-DAC comprising at least two 3-level I-DAC units coupled in parallel with each other, each 3-level I-DAC unit comprising:
   a switched current source;
   a level selection switch matrix coupled to the switched current source; and
   level selection logic coupled to the level selection switch matrix to control an output state of the 3-level I-DAC unit by switching output terminals of the 3-level I-DAC to the switched current source.

5. The ADC of claim 4, the level selection switch matrix comprising:
   a first switch coupled between the switched current source and a positive output terminal;
   a second switch coupled between a negative output terminal and a ground terminal;
   a third switch coupled between the switched current source and the negative output terminal;
   a fourth switch coupled between the positive output terminal and the ground terminal; and
   a fifth switch coupled between the switched current source and a common-mode terminal.

6. The ADC of claim 1, the mismatch-correcting split decimator comprising:
   a main decimator coupled to the modulator output terminals to generate the uncorrected ADC output data component by applying a decimation filtering to a weighted sum of occurrences of each of N modulator output levels at sampling times during a decimation interval, a count of occurrences of each output level weighted by a magnitude of the level;
   a number [(N−1)/2−1] of auxiliary decimators communicatively coupled to the modulator output terminals, each auxiliary decimator to apply the decimation filtering to a sum of occurrences of a subset of modulator output levels at sampling times during the decimation interval, the subset of modulator output levels predetermined to be influenced by at least one delta mismatch component, each auxiliary decimator subsequently to multiply a resulting decimated delta-influenced output data component by a predetermined factor of at least one of δ1, δ2 . . . δ_[(N−1)/2−1] in order to generate one of [(N−1)/2−(1)] ADC output data error components; and
   a summing junction coupled to an output terminal of the main decimator and to output terminals of the auxiliary decimator(s) to add the [(N−1)/2−(1)] ADC output data error components, one output data error component from each auxiliary decimator, to the uncorrected ADC output data component from the main decimator in order to generate the calibrated ADC output data corrected for δ1, δ2 . . . δ_[(N−1)/2−(1)].

7. The ADC of claim 6, further comprising:
   at least one modulator output level selector coupled between the modulator output terminals and each auxiliary decimator to select the delta-influenced output levels corresponding to each auxiliary decimator.

8. The ADC of claim 1, the mismatch measurement logic further comprising:
   a mismatch measurement input section coupled to the modulator input terminal to establish a calibration voltage ("V_CAL") at the modulator input terminal and to assign I-DAC current sources to level selection switch matrices prior to mismatch measurement intervals;
   a mismatch calculation section coupled to the modulator output terminals to determine δ1, δ2 . . . δ_[(N−1)/2−1]; and
   mismatch measurement control logic coupled to the mismatch measurement input section and to the mismatch calculation section to control a mismatch measurement process.

9. The ADC of claim 8, the mismatch measurement input section comprising:
   a calibration voltage source coupled to the modulator input terminal to generate V_CAL; and
   a mismatch measurement switch matrix component of the N-Level I-DAC to transpose a pair of switched current sources relative to an operational configuration by reassigning each current source of the pair to a level selection switch matrix assigned to the other current source in the operational configuration prior to each mismatch measurement interval following the first mismatch measurement interval.

10. The ADC of claim 9, the mismatch measurement switch matrix component for a 5-level I-DAC to couple a first of the switched current sources to a first level selection switch matrix and a second of the switched current sources to a second level selection switch matrix prior to a first mismatch measurement interval and to couple the first switched current source to the second level selection switch matrix and the second switched current source to the first level selection switch matrix prior to a second mismatch measurement interval.

11. The ADC of claim 8, the mismatch calculation section comprising:
   interval control logic coupled to the modulator output terminals to provide mismatch measurement access to modulator output levels during the mismatch measurement intervals;
   a set of level counters coupled to the interval control logic to count a first number of occurrences of each modulator output level during a first mismatch measurement interval in order to generate a first set of counts {A}=A1, A2 . . . A_N, the set of level counters to subsequently count a second number of occurrences of each modulator output level during a second mismatch measurement interval after transposing a first pair of the (N−1)/2 I-DAC current sources in the modulator feedback loop in order to generate a second set of counts {B}=B1, B2 . . . B_N, . . . the set of level counters to subsequently count a number of occurrences of each modulator output level during an $(N-1)/2^{th}$ mismatch measurement interval after interchanging an $[(N-1)/2-1]^{th}$ pair of the (N−1)/2 I-DAC current sources in the modulator feedback loop in order to generate a $(N-1)/2^{th}$ set of counts {Z}=Z1, Z2 . . . Z_N; and
   a mismatch calculator coupled to the level counters to calculate each of $\delta 1$, $\delta 2$ . . . $\delta\_[(N-1)/2-1]$ as a predetermined algebraic function of {A}, {B} . . . {Z}, the algebraic function resulting from V_CAL being equal to an average of each set of counts after each count is weighted by an amount equal to the level corresponding to the count and considering that each set of counts includes a delta mismatch component proportional to each of $\delta 1$, $\delta 2$ . . . $\delta\_[(N-1)/2-1]$ (V_CAL=AVG_{A_WEIGHTED}($\delta$)=AVG_{B_WEIGHTED}($\delta$) . . . =AVG_{Z_WEIGHTED}($\delta$)).

12. The ADC of claim 11, the mismatch calculator for a 5-level modulator configured to calculate delta as [(2A5+A4−A2−2A1)−(2B5+B4−B2−2B1)]/(A5+A4−A2−A1−B5−B1).

13. A method of generating calibrated output data from an N-level sigma-delta analog-to-digital converter ("ADC"), comprising:
   during a series of mismatch measurement intervals, counting occurrences of voltage levels at output terminals of a sigma-delta modulator portion of the ADC associated with each of (N−1)/2 configurations of an N-level current mode digital-to-analog converter ("I-DAC") negative feedback element associated with the modulator;
   determining an amplitude mismatch ("delta") between at least one pair of [(N−1)/2−(1)] current sources in the I-DAC from the counts of occurrences of the modulator output voltage levels;
   during normal operation of the ADC, applying a decimation filtering to output data from the modulator to generate an uncorrected ADC output data component;
   multiplying decimated modulator output levels predetermined to be delta-influenced by a predetermined factor of delta in order to generate at least one ADC output data error component; and
   summing the ADC output data error components with the uncorrected ADC output data component to generate calibrated ADC output data corrected for delta.

14. The method of generating calibrated output data from an N-level sigma-delta ADC of claim 13, further comprising:
   applying a reference voltage ("V_CAL") to an input terminal of the ADC during (N−1)/2 mismatch measurement intervals;
   in the N-level I-DAC, establishing an operational assignment of each of (N−1)/2 switched current sources to one of (N−1)/2 level selection switch matrices, the operational assignment to determine a contribution of each current from each switched current source to each of N modulator output levels;
   at the modulator output terminals, counting a number of occurrences of each modulator output level at sampling times during a first mismatch measurement interval in order to generate a first set of counts {A}=A1, A2 . . . A_N;
   transposing each of [(N−1)/2−(1)] pairs of the switched current sources relative to the operational assignment;
   at the modulator output terminals, counting a number of occurrences of each modulator output level during a subsequent mismatch measurement interval following each transposition of one of the pairs of switched current sources in order to generate subsequent sets of counts {B}=B1, B2 . . . B_N, {C}=C1, C2 . . . C_N . . . {Z}=Z1, Z2 . . . Z_N, modulator output data errors resulting from amplitude mismatches $\delta 1$, $\delta 2$ . . . $\delta\_[(N-1)/2-(1)]$ (collectively, "delta") between transposed current sources appearing in counts associated with predetermined modulator output levels during each mismatch measurement interval;
   calculating each of $\delta 1$, $\delta 2$ . . . $\delta\_[(N-1)/2-(1)]$ as an algebraic function of A1, A2 . . . A_N, B1, B2 . . . B_N, C1, C2 . . . C_N . . . Z1, Z2 . . . Z_N, each algebraic function resulting from V_CAL being equal to an average of each set of counts after each count is weighted by an amount equal to the level corresponding to the count (V_CAL=AVG_{A_WEIGHTED}($\delta$)=AVG_{B_WEIGHTED}($\delta$) . . . =AVG_{Z_WEIGHTED}($\delta$)).

15. The method of generating calibrated output data from an N-level sigma-delta ADC of claim 14, further comprising:
   disconnecting V_CAL from the ADC input terminal.

16. The method of generating calibrated output data from an N-level sigma-delta ADC of claim 14, further comprising:
   applying the decimation filtering to a weighted sum of occurrences of each of the N modulator output levels at sampling times during a decimation interval, a count of occurrences of each output level weighted by a magnitude of the level to generate the uncorrected ADC output data component;
   applying a decimation filtering to a sum of occurrences of each of [(N−1)/2−(1)] subsets of modulator output levels at sampling times during the decimation interval in order to generate [(N−1)/2−(1)] decimated delta-influenced output data components, each subset of modulator output levels predetermined to be influenced by at least one of the delta mismatch components $\delta 1, \delta 2 \ldots \delta\_[(N-1)/2-(1)]$;

multiplying each decimated delta-influenced output data component by a predetermined factor of at least one of $\delta 1, \delta 2 \ldots \delta\_[(N-1)/2-1]$ in order to generate one of $[(N-1)/2-(1)]$ ADC output data error components; and summing the $[(N-1)/2-(1)]$ ADC output data error components to the uncorrected ADC output data component in order to generate calibrated ADC output data corrected for $\delta 1, \delta 2 \ldots \delta\_[(N-1)/2-(1)]$.

17. The method of generating calibrated output data from an N-level sigma-delta ADC of claim 16, further comprising:

normalizing I-DAC output current levels such as to remove delta components from current levels of greatest positive and negative magnitudes.

18. The method of generating calibrated output data from an N-level sigma-delta ADC of claim 16, further comprising:

selecting the $[(N-1)/2-(1)]$ subsets of modulator output levels.

19. A method of determining mismatch errors in an N-level sigma-delta analog-to-digital converter ("ADC"), comprising:

applying a reference voltage ("V_CAL") to an input terminal of the ADC during $(N-1)/2$ mismatch measurement intervals;

in an N-level current mode digital-to-analog converter ("I-DAC") negative feedback element associated with a sigma-delta modulator portion of the ADC, establishing an operational assignment of each of $(N-1)/2$ switched current sources to one of $(N-1)/2$ level selection switch matrices, the operational assignment to determine a contribution of each current from each switched current source to each of N modulator output levels;

at output terminals of the modulator, counting a number of occurrences of each modulator output level at sampling times during a first mismatch measurement interval in order to generate a first set of counts $\{A\}=A1, A2 \ldots A\_N$;

transposing each of $[(N-1)/2-(1)]$ pairs of the switched current sources relative to the operational assignment;

at the modulator output terminals, counting a number of occurrences of each modulator output level during a subsequent mismatch measurement interval following each transposition of one of the pairs of switched current sources in order to generate subsequent sets of counts $\{B\}=B1, B2 \ldots B\_N, \{C\}=C1, C2 \ldots C\_N \ldots \{Z\}=Z1, Z2 \ldots Z\_N$, modulator output data errors resulting from amplitude mismatches $\delta 1, \delta 2 \ldots \delta\_[(N-1)/2-(1)]$ between transposed current sources appearing in counts associated with predetermined modulator output levels during each mismatch measurement interval; and calculating each of $\delta 1, \delta 2 \ldots \delta\_[(N-1)/2-(1)]$ as an algebraic function of $A1, A2 \ldots A\_N, B1, B2 \ldots B\_N, C1, C2 \ldots C\_N \ldots Z1, Z2 \ldots Z\_N$, each algebraic function resulting from V_CAL being equal to an average of each set of counts after each count is weighted by an amount equal to the level corresponding to the count (V_CAL=AVG_{A_WEIGHTED}$(\delta)$= AVG_{B_WEIGHTED}$(\delta) \ldots$ =AVG_{Z_WEIGHTED}$(\delta)$).

20. The method of determining mismatch errors in an N-level sigma-delta ADC of claim 19, further comprising:

transposing a connection between a first pair of the $(N-1)/2$ switched current sources and their respective level switch matrices relative to the operational assignment, the first pair of switched current sources having a first magnitude mismatch ("$\delta 1$") between their respective currents;

counting a second number of occurrences of each modulator output level at sampling times during a second mismatch measurement interval in order to generate a second set of counts $\{B\}=B1, B2 \ldots B\_N$;

transposing a connection between a second pair of the $(N-1)/2$ switched current sources and their respective level switch matrices relative to the operational assignment, the second pair of switched current sources having a second magnitude mismatch ("$\delta 2$") between their respective currents;

counting a third number of occurrences of each modulator output level at sampling times during a third mismatch measurement interval in order to generate a third set of counts $\{C\}=C1, C2 \ldots C\_N$;

transposing a connection between an $[(N-1)/2-1]$th pair of the $(N-1)/2$ switched current sources and their respective level switch matrices relative to the operational assignment, the $[(N-1)/2-1]$th pair of switched current sources having an $[(N-1)/2-1]$th magnitude mismatch ("$\delta\_[(N—1)/2-1]$") between their respective currents; and counting a number of occurrences of each modulator output level at sampling times during a $(N-1)/2$th mismatch measurement interval in order to generate a $(N-1)/2$th set of counts $\{Z\}=Z1, Z2 \ldots Z\_N$.

* * * * *